(12) United States Patent
Tanase et al.

(10) Patent No.: US 6,590,914 B1
(45) Date of Patent: Jul. 8, 2003

(54) SEMICONDUCTOR LASER DRIVE CIRCUIT

(75) Inventors: Hironobu Tanase, Kanagawa (JP); Isao Ichimura, Tokyo (JP)

(73) Assignee: Sony Corporation, Tokyo (JP)

( * ) Notice: Subject to any disclaimer, the term of this patent is extended or adjusted under 35 U.S.C. 154(b) by 143 days.

(21) Appl. No.: 09/611,605

(22) Filed: Jul. 7, 2000

(30) Foreign Application Priority Data

Jul. 16, 1999 (JP) ............................................. 11-203190

(51) Int. Cl.[7] .............................................. H01S 5/042
(52) U.S. Cl. ................................................. 372/38.02
(58) Field of Search ........................ 372/38.01–38.09

(56) References Cited

U.S. PATENT DOCUMENTS

| | | | | |
|---|---|---|---|---|
| 4,819,024 A | * | 4/1989 | Kaku et al. | 372/38.02 |
| 5,579,329 A | * | 11/1996 | Taguchi | 372/38.01 |
| 5,661,739 A | * | 8/1997 | Ohashi | 372/29.011 |
| 5,694,409 A | * | 12/1997 | Taguchi | 372/29.011 |
| 5,848,044 A | * | 12/1998 | Taguchi et al. | 369/53.26 |
| 6,002,699 A | * | 12/1999 | Gotoh | 372/38.02 |
| 6,011,768 A | * | 1/2000 | Taguchi | 369/116 |
| 6,111,901 A | * | 8/2000 | Taguchi et al. | 372/38.02 |
| 6,320,890 B1 | * | 11/2001 | Taguchi | 372/38.02 |
| RE37,524 E | * | 1/2002 | Taguchi | 372/29.011 |
| 6,345,062 B1 | * | 2/2002 | Taguchi et al. | 372/38.01 |

* cited by examiner

*Primary Examiner*—Paul Ip
*Assistant Examiner*—Jeffrey Zahn
(74) *Attorney, Agent, or Firm*—Oblon, Spivak, McClelland, Maier & Neustadt, P.C.

(57) ABSTRACT

A semiconductor laser drive circuit capable of improving a driving speed of a high resistance semiconductor laser such as a GaN-based semiconductor laser, comprising a buffer circuit for shaping waveforms of input signals, a level-shift circuit for shifting the levels of output signals of the buffer circuit, a switch circuit for controlling and outputting signal levels of output signals of the level-shift circuit based on switch control signals, a combining circuit for combining output signals of the switch circuit, and a source follower for supplying power to a high resistance semiconductor laser based on an output signal of the combining circuit. The high resistance semiconductor laser is for example a GaN-based semiconductor laser for emitting blue-violet laser light.

6 Claims, 6 Drawing Sheets

SEMICONDUCTOR LASER DRIVE CIRCUIT

BACKGROUND OF THE INVENTION

1. Field of the Invention

The present invention relates to a semiconductor laser drive circuit for driving a GaN (gallium nitride)-based semiconductor laser or other high resistance semiconductor laser.

2. Description of the Related Art

Optical disks, types of information recording media, have been made increasingly high in density and large in capacity in recent years.

Along with the increase in density and larger capacity, it is required that the pulse width of emission of laser light be short and that an edge of a waveform of the laser light be sharp.

A semiconductor laser drive circuit of the related art for driving a semiconductor laser controls an output of laser light of the semiconductor laser by switching the size of the drive current.

For example, a semiconductor laser drive circuit of the related art has a plurality of constant current circuits (for plurality of channels) using transistors. It adds the output currents of the constant current circuits and supplies the result the semiconductor laser.

Summarizing the problems of the present invention, with the above semiconductor laser drive circuit of the related art, since there is a parasitic capacity at the output terminal of each constant current circuit, the total parasitic capacity becomes larger along with the increase in number of constant current circuits.

Further, since a constant current circuit is configured by transistors, a mirror effect arises by the capacity between an input and an output.

Due to these factors, the frequency characteristics and transient characteristics deteriorate in a semiconductor laser drive circuit of the related art, thus it becomes difficult to shorten the pulse width of emission of the semiconductor laser and increase the speed of the drive.

Especially, since a GaN-based semiconductor laser for emitting blue-violet laser light has a larger impedance comparing with other semiconductor lasers, it is difficult to drive it at a high speed by a current-control type semiconductor laser drive circuit of the related art.

SUMMARY OF THE INVENTION

An object of the present invention is to provide a semiconductor laser drive circuit capable of improving a driving speed of a GaN-based semiconductor laser or other high resistance semiconductor laser.

According to a first aspect of the present invention, there is provided a semiconductor laser drive circuit for driving a high resistance semiconductor laser, comprising a control circuit for generating a drive control signal and a low output impedance drive element for driving the high resistance semiconductor laser by a voltage based on the drive control signal.

Preferably, the control circuit comprises a first switch circuit supplied with a first input signal and a first switch control signal and controlling and outputting a signal level of the first input signal based on the first switch control signal; a second switch circuit supplied with a second input signal and a second switch control signal for controlling and outputting a signal level of the second input signal based on the second switch control signal; and a combining circuit for combining output signals of the first and second switch circuits to generate the drive control signal.

Preferably, the circuit further comprises a constant voltage circuit for generating a biasing use constant voltage signal. Also, the high resistance semiconductor laser is driven in accordance with a plurality of operation modes, and the combining circuit combines the constant voltage signal and an output signal of the first switch circuit when in a first operation mode and combines the constant voltage signal and outputs of the first and second switch circuits when in a second operation mode.

More preferably, the circuit further comprises an oscillation circuit for generating an oscillation signal, wherein the combining circuit combines the constant voltage signal and the oscillation signal when in a third operation mode.

Still more preferably, the circuit further comprises a resonance circuit connected between the oscillation circuit and the combining circuit. The combining circuit combines the oscillation signal passed through the resonance circuit and the constant voltage signal when in the third operation mode.

Preferably, the circuit further comprises a first level-shift circuit supplied with a third input signal for generating the first input signal by shifting the level of the third input signal and a second level-shift circuit supplied with a fourth input signal for generating the second input signal by shifting the level of the fourth input signal.

More preferably, each of the first and second level-shift circuits is a differential amplifying circuit comprised by an emitter coupled logic circuit; the first switch circuit is a current switch logic circuit with a power source connected to an emitter of differential pair transistors and with an output current of the power source set by the first switch control signal; and the second switch circuit is a current switch logic circuit with a power source connected to an emitter of differential pair transistors and with an output current of the power source set by the second switch control signal.

More preferably, the circuit further comprises a first waveform shape circuit supplied with a fifth input signal for shaping a waveform of the fifth input signal to generate the third input signal and a second waveform shape circuit supplied with a fifth input signal for shaping a waveform of the sixth input signal to generate the fourth input signal.

Preferably, the circuit further comprises a power source circuit for supplying a power source voltage to the high resistance semiconductor laser via the low output impedance drive element. The power source circuit outputs the power source voltage to the low output impedance drive element when a control signal of the power source circuit is in an enabled state, while stops outputting the power source voltage when a control signal of the power source circuit is in a disabled state.

Preferably, the circuit further comprises a detection circuit for detecting an inflowing current or an emission intensity of the high resistance semiconductor laser and a feedback circuit for feeding back an output signal of the detection circuit to the low output impedance drive element.

Preferably, the high resistance semiconductor laser comprises a GaN-based semiconductor laser; the low output impedance drive element comprises a field effect transistor; and the GaN-based semiconductor laser is driven by a source follower using the field effect transistor.

According to a second aspect of the present invention, there is provided a semiconductor laser drive circuit for driving a high resistance semiconductor laser, comprising a control circuit for generating a drive control signal; a low output impedance drive element for driving the high resistance semiconductor laser based on the drive control signal by a voltage; and a constant current circuit connected to a connection point of the low output impedance drive element and the high resistance semiconductor laser.

Preferably, the high resistance semiconductor laser and the low output impedance drive element are connected via a capacitor; the connection point of the capacitor and the low output impedance drive element is grounded via a first resistance element; and the constant current circuit is connected to a connection point of the capacitor and the high resistance semiconductor laser.

Preferably, the high resistence semiconductor laser and the constant current circuit are connected via an inductor or a second resistance element.

Preferably, the high resistance semiconductor laser comprises a GaN-based semiconductor laser; the low output impedance drive element comprises a field effect transistor; and the GaN-based semiconductor laser is driven by a source follower using the field effect transistor.

The above first and second aspects of the present invention drive the high resistance semiconductor laser by a low output impedance drive element, so can effectively supply power to the high resistance semiconductor laser.

Also, by supplying power to the high resistance semiconductor laser via a low output impedance drive element, they can suppress the mirror effect and can improve the driving speed of the high resistance semiconductor laser.

By being configured to be powered by a source follower, the high resistance semiconductor laser can suppress the mirror effect in a field effect transistor and can improve the driving speed a GaN-based semiconductor laser or other high resistance laser.

Also since the semiconductor laser drive circuit according to the second aspect of the present invention is provided with a constant current circuit connected to a connection point of a low output impedance drive element and a high resistance semiconductor laser, it can supply a constant current to the high resistance semiconductor laser and can output laser light corresponding to the constant current under normal conditions.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 1:
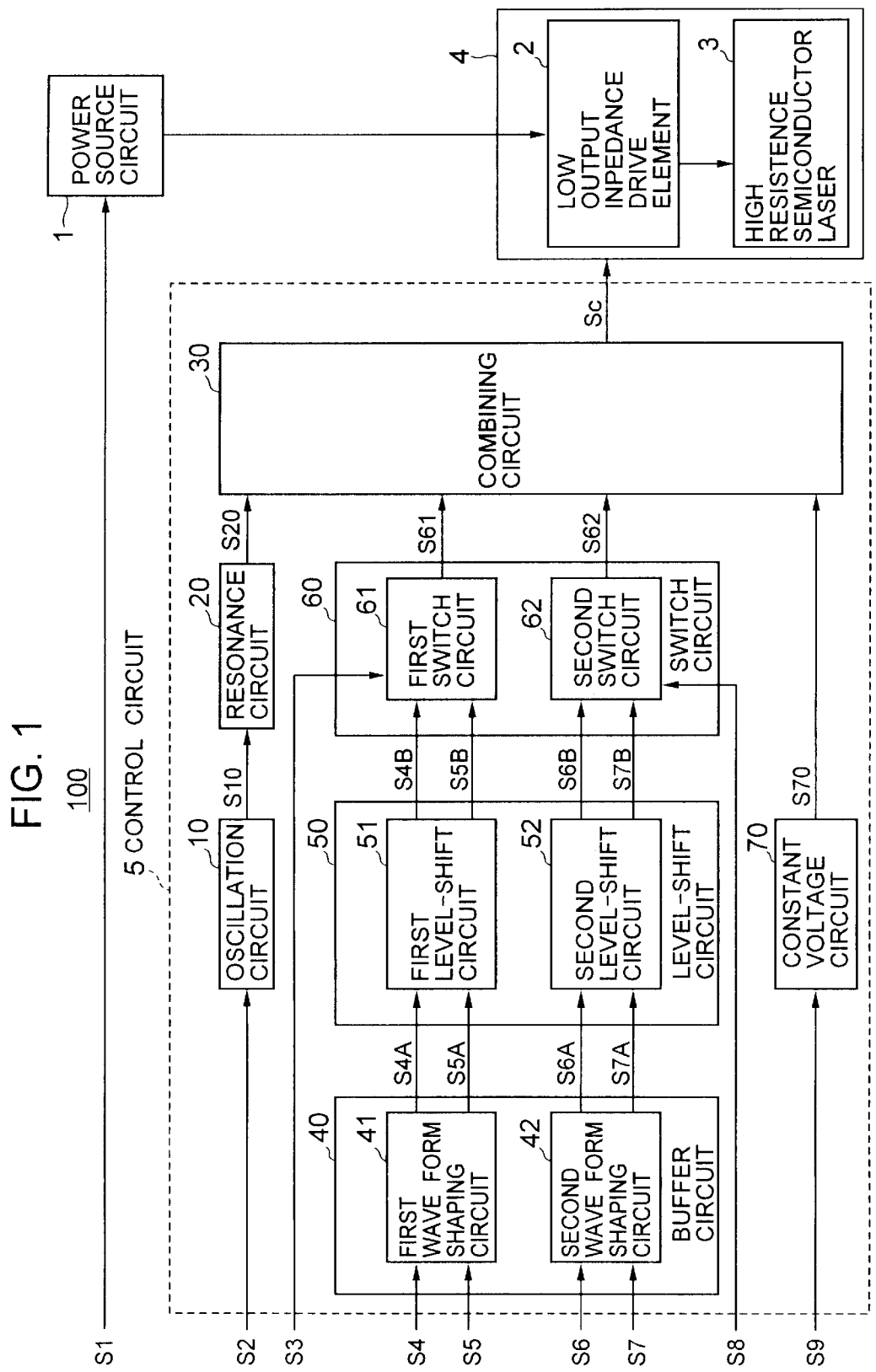
FIG. 1 is a schematic block diagram of the configuration of a semiconductor laser drive circuit according to a first embodiment of the present invention.

FIG. 1 is a schematic block diagram of the configuration of a semiconductor laser drive circuit according to a first embodiment of the present invention.

In this embodiment, a semiconductor laser drive circuit 100 is installed in a recording/reproducing apparatus for recording information on an optical disk and reproducing information stored on an optical disk.

The semiconductor laser drive circuit 100 comprises a power source 1, a source follower (drain ground circuit) 4, and a control circuit 5 for generating a drive control signal Sc.

The source follower 4 comprises a low output impedance drive element 2 and a high resistance semiconductor laser 3.

The low impedance drive element 2 is comprised of, for example, an enhancement type n-channel field effect transistor (FET).

The high resistance semiconductor laser 3 is comprised of, for example, a GaN-based semiconductor laser (GaN-based semiconductor laser diode) for outputting blue-violet laser light.

Next, the case will be explained where the low output impedance drive element 2 is an FET and the high resistance semiconductor laser 3 is a GaN-based semiconductor laser.

A drain of the FET 2 is connected to a power source circuit 1 and a source is connected to the GaN-based semiconductor laser 3.

The control circuit 5 comprises an oscillation circuit 10, a resonance circuit 20, a combining circuit 30, a buffer circuit 40, a level-shift circuit 50, a switch circuit 60, and a constant voltage circuit 70.

The buffer circuit 40 comprises a first waveform shaping circuit 41 and a second waveform shaping circuit 42.

The level-shift circuit 50 comprises a first level-shift circuit 51 and a second level-shift circuit 52.

The switch circuit 60 comprises a first switch circuit 61 and a second switch circuit 62.

The first waveform shaping circuit 41 receives as an input fifth input signals S4 and S5. The fifth input signals S4 and S5 are in a relationship of an inverted signal and a non-inverted signal and form a pair.

The second waveform shaping circuit 42 receives as an input sixth input signals S6 and S7. The sixth input signals S6 and S7 are in a relationship of an inverted signal and a non-inverted signal and form a pair.

Note that in the case of a first operation mode, that is, in the case of erasing information stored on an optical disk (at the time of erasure), the input signals S4 and S5 are supplied only to the first waveform shaping circuit 41 among the first and second waveform shaping circuits 41 and 42.

Also, in the case of a second operation mode, that is, when writing for storing information on the optical disk (at the time of recording), the input signals S4 and S5 are supplied to the first waveform shaping circuit 41, while the input signals S6 and S7 are supplied to the second waveform shaping circuit 42. The emission output (emission intensity) of the GaN-based semiconductor laser 3 becomes larger at the time of recording than at the time of erasure.

Further, in the case of a third operation mode, that is, when reading information stored on the optical disk (at the time of reproducing), input signals are not supplied to the first and second waveform shaping circuits 41 and 42.

The first waveform shaping circuit 41 performs waveform shaping on the fifth input signals S4 and S5 to generate signals S4A and S5A and supplies the signals S4A and S5A as third input signals to the first level-shift circuit 51.

The second waveform shaping circuit 42 performs waveform shaping on the fifth input signals S6 and S7 to generate signals S6A and S7A and supplies the signals S6A and S7A as fourth input signals to the first level-shift circuit 52.

The first and second waveform shaping circuits 41 and 42 receive as input a signal of a p-ECL level, output a signal of a p-ECL level, and shape a signal with a blunt edge to a signal with a sharp edge.

By configuring the circuit as such, the buffer circuit 40 can prevent the waveform of an input signal from becoming blunt when the transfer path of the input signal is extended.

The first level-shift circuit 51 shifts the levels (signal levels) of the third input signals S4A and S5A to generate signals S4B and S5B and supplies the signals S4B and S5B as first input signals to the first switch circuit 61.

The second level-shift circuit 52 shifts the levels (signal levels) of the fourth input signals S6A and S7A to generate signals S6B and S7B and supplies the signals S6B and S7B as second input signals to the second switch circuit 62.

The first and second level-shift circuits 51 and 52 are comprised by a differential amplifying circuits comprised of emitter coupled logic (ECL) circuits.

The first switch circuit 61 amplifies the first input signals S4B and S5B based on the first switch control signal S3 to generate a first amplification signal S61 and supplies the first amplification signal S61 to the combining circuit 30.

The amplification degree of the first switch circuit 61 can be adjusted by a first amplification control signal (first switch control signal) S3.

The second switch circuit 62 amplifies the second input signals S6B and S7B based on a second switch control signal S8 to generate a second amplification signal S62 and supplies the second amplification signal S62 to the combining circuit 30.

The amplification degree of the second switch circuit 62 can be adjusted by a second amplification control signal (second switch control signal) S8.

The first and second switch circuits 61 and 62 are comprised by a current switch logic (CSL) circuit comprised by an ECL circuit.

The constant voltage circuit 70 generates a constant voltage signal S70 for biasing based on a setting signal S9 and supplies the constant voltage signal S70 to the combining circuit 30.

A bias voltage of a gate input signal of the FET 2 can be adjusted by the setting signal S9 and an output power of the GaN-based semiconductor laser 3 can be set.

The oscillation circuit 10 generates an oscillation signal S10 of a predetermined frequency based on an oscillation control signal S2 and supplies the oscillation signal S10 to the resonance circuit 20.

The oscillation circuit 10 generates an oscillation signal S10 when the oscillation control signal S2 is in a first state, while stops generating the oscillation signal S10 when the oscillation control signal S2 is in a second state.

The oscillation control signal S2 of the first state is supplied to the oscillation circuit at the time of reproduction.

The resonance circuit 20 is comprised by an LC resonance circuit comprised of a capacitor C and an inductor L connected in series, passes a signal S20 of a specific frequency from the oscillation signal 10, and supplies the passing signal S20 to the combining circuit 30.

The combining circuit 30 is supplied with the passing signal S20, first and second amplification signals S61 and S62, and constant current signal S70, selectively combines the signals to generate a combined signal Sc, and supplies the combined signal Sc to the source follower 4.

At the time of erasure, the combining circuit 30 adds the first amplification signal S61 and the constant voltage signal S70 to generate a combined signal Sc and supplies the combined signal Sc to the gate of the FET 2.

At the time of recording, the combining circuit 30 adds the first and second amplification signals S61 and S62 and the constant voltage signal S70 to generate a combined signal Sc and supplies the combined signal Sc to the gate of the FET 2.

At the time of reproduction, the combining circuit 30 adds the passing signal S20 and the constant voltage signal S70 to generate a combined signal Sc and supplies the combined signal Sc to the gate of the FET 2.

The power source circuit 1 generates a power source voltage Vp for driving the GaN-based semiconductor laser 3 based on the power source control signal S1 and supplies the power source voltage Vp to a drain of the FET 2 of the source follower 4.

When the power source control signal S1 is in an enabled state (one state), the power source circuit 1 generates a power source voltage Vp and the GaN-based semiconductor laser 3 outputs laser light.

When the power source control signal S1 is in a disabled state (other state), the power source circuit 1 stops generating the power source voltage Vp to make the output voltage to the FET 2 0V and the GaN-based semiconductor laser 3 stops outputting laser light.

The FET 2 is supplied with the combined signal Sc as a gate input signal and supplies power to the GaN-based semiconductor laser 3 based on the combined signal Sc.

The signal level of the combined signal Sc at the time of recording is larger than that at the time of erasure. Accordingly, a larger voltage is applied to the GaN-based semiconductor laser 3 at the time of recording than at the time of erasure. As a result, the emission output of the GaN-based semiconductor laser 3 at the time of recording becomes larger than that at the time of erasure.

Since the combined signal Sc at the time of reproducing is comprised of a signal obtained by adding the passing signal S20 of a specific frequency and the constant voltage signal S70, a specific frequency can be superimposed onto the laser light from the GaN-based semiconductor laser 3.

Also, the laser light output from the GaN-based semiconductor laser 3 can be made larger compared with the case where the combined signal Sc at the time of reproducing is comprised of a constant voltage signal S70, thus it is possible to reduce the laser light noise at the time of low output of laser light.

Figure 2:
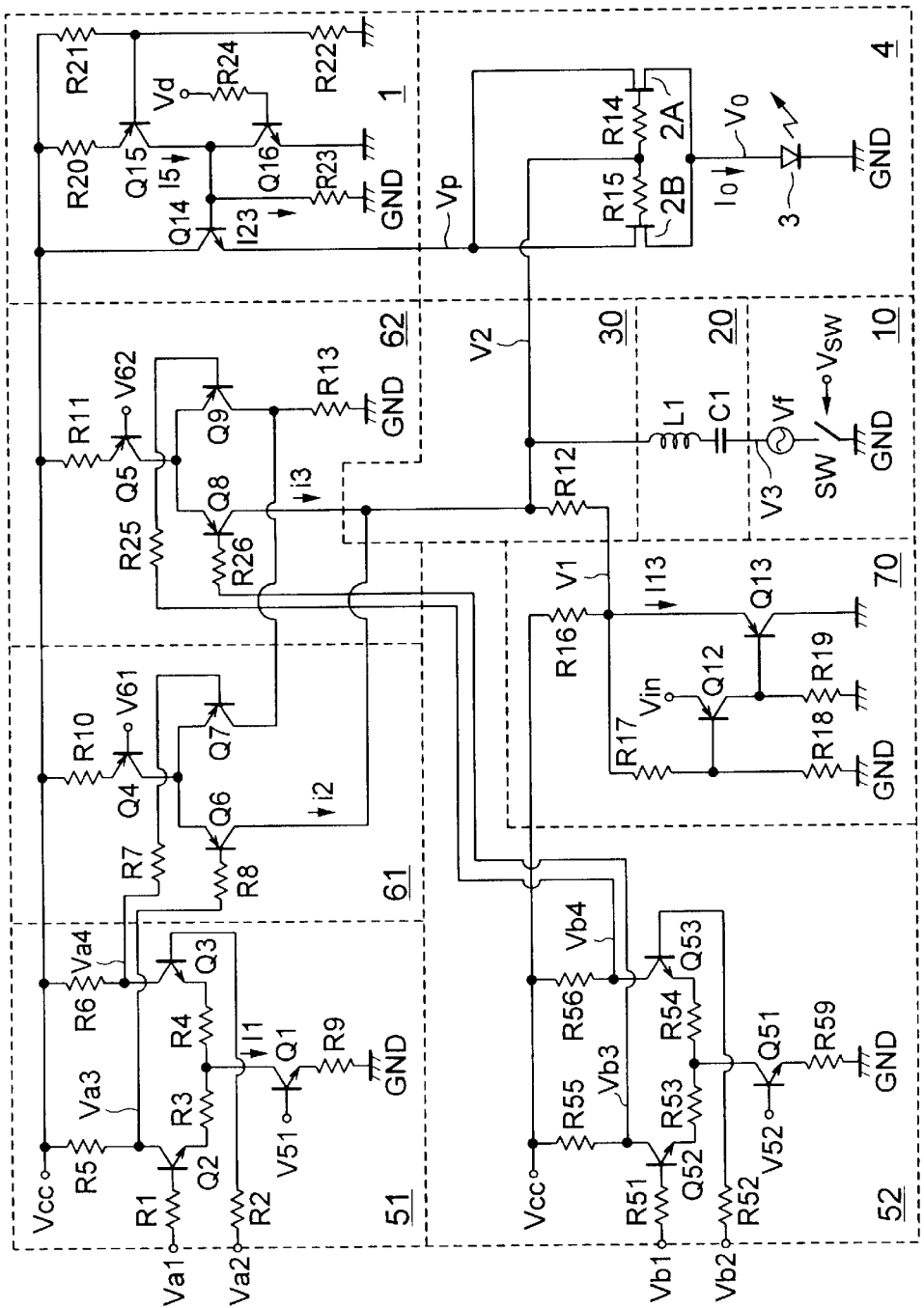
FIG. 2 is a circuit diagram of a semiconductor laser drive circuit of FIG. 1.

FIG. 2 is a circuit diagram of the semiconductor laser drive circuit 100 of FIG. 1, wherein the buffer circuit 40 is omitted. Note that the reference GND in the figure indicates a ground potential (ground level).

The input signal S4A is input as an input voltage Va1 to the first level-shift circuit 51.

The input signal S5A is input as an input voltage Va2 to the first level-shift circuit 51.

The input signal S6A is input as an input voltage Vb1 to the second level-shift circuit 52.

The input signal S7A is input as an input voltage Vb2 to the second level-shift circuit 52.

The first switch control signal S3 is input as an input voltage V61 to the first switch circuit 61.

The second switch control signal S8 is input as an input voltage V62 to the second switch circuit 62.

The power source control signal S1 is input as an input voltage Vd to the power source circuit 1.

The oscillation control signal S2 is input as an input voltage Vsw to the oscillation circuit 10.

The setting signal S9 is input as an input voltage Vin to the constant voltage circuit 70.

The first level-shift circuit 51 comprises collector resistors R5 and R6 supplied with a power source voltage Vcc, base resistors R1 and R2 supplied with input voltages Va1 and Va2, emitter resistors R3 and R4, differential pair transistors Q2 and Q3, a transistor Q1, and a grounded load resistor R9.

The transistors Q1, Q2, and Q3 are npn transistors.

The resistance values of the collector resistors R5 and R6 are equal, the resistance values of the base resistors R1 and R2 are equal, the resistance values of the emitter resistors R3 and R4 are equal, and the characteristics of the transistors Q2 and Q3 are equal.

The collector of the transistor Q1 is connected to a connection point of the emitter resistors R3 and R4, the emitter is connected to the load resistor R9, and the base is supplied with an input voltage V51. The collector current I1 of the transistor Q1 is set by the input voltage V51.

A constant current source for making a collector current of the transistor Q1 constant is formed by the transistor Q1 and the load resistor R9. The constant current source, depending on the input voltage V51, outputs a constant current at the time of erasure (first operation mode) and recording (second operation mode) and stop outputting a current at the time of reproduction (third operation mode).

The base of the transistor Q2 is connected to the base resistor R1, the collector is connected to the collector resistor R5, and the emitter is connected to the emitter resistor R3.

The base of the transistor Q3 is connected to the base resistor R2, the collector is connected to the collector resistor R6, and the emitter is connected to the emitter resistor R4.

The first level-shift signal S4B is supplied as a collector voltage Va3 of the transistor Q2 to the base resistor R8 in the first switch circuit 61.

The first level-shift signal S5B is supplied as a collector voltage Va4 of the transistor Q3 to the base resistor R7 in the first switch circuit 61.

The second level-shift circuit 52 comprises collector resistors R55 and R56 supplied with a power source voltage Vcc, base resistors R51 and R52 supplied with input voltages Vb1 and Vb2, emitter resistors R53 and R54, differential pair transistors Q52 and Q53, a transistor Q51, and a grounded load resistor R59.

The transistors Q51, Q52, and Q53 are npn transistors.

The resistance values of the collector resistors R55 and R56 are equal, the resistance values of the emitter resistors R51 and R52 are equal, the resistance values of the emitter resistors R53 and R54 are equal, and the characteristics of the transistors Q52 and Q53 are equal.

A collector of the transistor Q51 is connected to a connection point of the emitter resistors R53 and R54, the emitter is connected to the load resistor R59, and the base is supplied with an input voltage V52. The collector current of the transistor Q51 is set by the input voltage V52.

A constant current source for making a collector current of the transistor Q51 constant is formed by the transistor Q51 and the load resistor R59. The constant current source, depending on the input voltage V52, outputs a constant current at the time of recording (second operation mode) and stops outputting a current at the time of erasure (first operation mode) and at the time of reproduction (third operation mode).

The base of the transistor Q52 is connected to the base resistor R51, the collector is connected to the collector resistor R55, and the emitter is connected to the emitter resistor R53.

The base of the transistor Q53 is connected to the base resistor R52, the collector is connected to the collector resistor R56, and the emitter is connected to the emitter resistor R54.

The second level-shift signal S6B is supplied as a collector voltage Vb3 of the transistor Q52 to the base resistor R26 in the second switch circuit 62.

The second level-shift signal S7B is supplied as a collector voltage Vb4 of the transistor Q53 to the base resistor R25 in the second switch circuit 62.

The first switch circuit 61 comprises a load resistor RIO supplied with a power source voltage Vcc, a transistor Q4, differential pair transistors Q6 and Q7, and base resistors R7 and R8.

The transistors Q4, Q6, and Q7 are pnp transistors.

The resistance values of the base resistors R7 and R8 are equal and the characteristics of the transistors Q6 and Q7 are equal.

The collector of the transistor Q4 is connected to a connection point of the emitters of the differential pair transistors Q6 and Q7, the emitter is connected to the load resistor R10, the base is supplied with an input voltage V61, and a collector voltage of the transistor Q4 is set by the input voltage V61.

A constant current source for making a collector current of the transistor Q4 constant is formed by the transistor Q4 and the load resistor Q10. The constant current source, depending on the input voltage V61, outputs a constant current at the time of erasure and recording and stops current output at the time of reproduction.

The emitter of the transistor Q7 is connected to the collector of the transistor Q4, the base is connected to the base resistor R7, and the collector is connected to the resistor R13.

The emitter of the transistor Q6 is connected to the collector of the transistor Q4, the base is connected to the base resistor R8, and the collector is connected to the signal combining resistor R12.

The amplification signal S61 is supplied as a collector voltage or a collector current i2 of the transistor Q6 to the resistor R12.

The second switch circuit 62 comprises a load resistor R11 supplied with a power source voltage Vcc, a transistor Q5, differential pair transistors Q8 and Q9, base resistors R26 and R25, and a grounded collector R13.

The transistors Q5, Q8, and Q9 are pnp transistors.

The resistance values of the base resistors R25 and R26 are equal and the characteristics of the transistors Q8 and Q9 are equal.

The collector of the transistor Q5 is connected to a connection point of both emitters of the differential pair transistors Q8 and Q9, the emitter is connected to the load resistor R11, an input voltage V62 is supplied to the base, and a collector voltage of the transistor Q5 is set by the input voltage V62.

A constant current source for making a collector current of the transistor Q5 constant is formed by the transistor Q5 and the load resistor Q11. The constant current source, depending on the input voltage V62, outputs a constant current at the time of recording and stops current output at the time of erasure and reproduction.

The emitter of the transistor Q9 is connected to the collector of the transistor Q5, the base is connected to the base resistor R25, and the collector is connected to the resistor R13.

The emitter of the transistor Q8 is connected to the collector of the transistor Q5, the base is connected to the base resistor R26, and the collector is connected to the signal combining resistor R12.

The amplification signal S62 is supplied as a collector voltage or a collector current i3 of the transistor Q8 to the resistor R12.

The constant voltage circuit 70 comprises a resistor R16 supplied with a power source voltage Vcc, a resistor R17, grounded resistors R18 and R19, and transistors Q12 and Q13.

The transistors Q12 and Q13 are pnp transistors.

The power source voltage Vcc is divided by the resistors R16, R17, and R18 connected in series.

An emitter of the transistor Q12 is supplied with an input voltage Vin, the base is connected to a connection point of the resistors R17 and R18 and supplied with a constant voltage, and the collector is connected to the resistor R19.

The emitter of the transistor Q13 is connected to a connection point of the resistors R16, R17, and R12, the base is connected to the resistor R19, and the collector is grounded.

The collector of the transistor Q12 is connected to the base of the transistor Q13.

The constant voltage circuit 70 makes an emitter voltage (emitter potential) of the transistor Q13 a constant voltage V1 and supplies the constant voltage V1 as a constant voltage signal S70 to the resistor R12.

The oscillation circuit 10 comprises a signal source Vf for generating a sine signal of a predetermined frequency and a grounded switching element SW. The switching element SW is controlled by an input voltage Vsw.

The signal source Vf is connected to the switching element SW.

The switching element SW becomes on at the time of reproduction. As a result, the signal source Vf oscillates to generate an output voltage V3. The oscillation signal S10 is supplied as an output voltage V3 to the resonance circuit 20.

The switching element SW becomes off at the time of recording and erasure. As a result, the signal source Vf stop oscillating.

The resonance circuit 20 comprises an inductor L1 and a capacitor C1. The inductor L1 and the capacitor C1 are connected in series.

The resonance circuit 20 passes the signal voltage of a specific frequency pass from the output signal from the oscillation circuit 10 and supplies it as the passing signal S20 to the resistor R12.

The combining circuit 30 comprises a resistor R12.

One end of the resistor R12 is connected to an emitter of the transistor Q13 and is supplied with a constant voltage V1.

The other end of the resistor R12 is connected to collectors of transistors Q6 and Q8, the inductor L1, and a connection point of the resistors R14 and R15.

The resistance values of the resistors R12 and R13 are equal.

The power source circuit 1 comprises resistors R20 and R21 supplied with a power source voltage Vcc, transistors Q14, Q15, and Q16, a base resistor R24, and grounded resistors R22 and R23.

The transistors Q14 and Q16 are npn transistors and the transistor Q15 is a pnp transistor.

The power source voltage Vcc is divided by the resistors R21 and R22.

The collector of the transistor Q14 is supplied with a power source voltage Vcc, the emitter is connected to drains of FETs 2A and 2B, and the base is connected to the resistor R23.

The collector of the transistor Q15 is connected to the resistor R23, the emitter is connected to the resistor R20, and the base is connected to a connection point of the resistors R21 and R22 and supplied with a constant voltage.

The collector of the transistor Q16 is connected to the resistor R23, the emitter is grounded, and the base is connected to the base resistor R24.

The base of the transistor Q14 and the collectors of the transistors Q15 and Q16 are connected to each other.

The power source circuit 1 makes an emitter voltage of the transistor Q14 a constant power source voltage Vp and supplies the power source voltage Vp to the source follower 4.

The source follower 4 comprises gate resistors R14 and R15, FETs 2A and 2B, and a GaN-based semiconductor laser 3. If examining correspondence with the FET2 in FIG. 1, the FETs 2A and 2B are used as the FET 2.

The resistance values of the gate resistors R14 and R15 are equal and the characteristics of the FET 2A and FET 2B are equal.

The FETs 2A and 2B are GaAs metal semiconductor field effect transistors (MESFET) and are capable of operating at a high speed.

The gate of the FET 2A is connected to the gate resistor R14, the drain is connected to the emitter of the transistor Q14, and the source is connected to an anode of the GaN-based semiconductor laser 3.

The gate of the FET 2B is connected to a gate resistor R15, the drain is connected to the emitter of the transistor Q14, and the source is connected to an anode of the GaN-based semiconductor laser 3. The cathode of the GaN-based semiconductor laser 3 is grounded.

A connection point of the resistors R14 and R15 is connected to the resistor R12.

By providing the resistors R14 and R15, there is an advantage that it is possible to prevent a current from flowing in a forward direction between the gate and source of the FETs 2A and 2B when the voltage V2 rises and to absorb individual differences between the FETs 2A and 2B.

Next, the operation of the circuit will be explained.

The first and second level-shift circuits 51 and 52 are differential amplifying circuits.

An operation point is decided by a collector current I1 of the transistor Q1 and a collector resistance (load resistor) R5. The operation point voltage Va can be expressed by the formula (1) below. Note that a resistance value of the load resistor R5 is expressed as R5.

$$Va=Vcc-(I1 \times R5)/2 \qquad (1)$$

Further, if the differential input voltage Via is made |Va2−Va1| and the differential output voltage Voa is made |Va4−Va3|, the relationship between the differential input voltage Via and the differential output voltage Voa is shown by the formula (2). Note that the resistance value of the load resistor R3 is expressed as R3.

$$Voa=Via \times (R5/R3) \qquad (2)$$

The first and second level-shift circuits 51 and 52 prevent the transistors Q6 to Q9 of the first and second switch circuits 61 and 62 from being saturated even if a high voltage is required for the control voltage V2 of the source follower 4 by shifting the levels of the input voltages Va1, Va2, Vb1, and Vb2.

Also, the first and second level-shift circuits 51 and 52 amplify the input voltages Va1, Va2, Vb1, and Vb2 to voltages for turning on and off the pn junctions of the transistors Q6 to Q9 so that the first and second switch circuits 61 and 62 can perform accurate switching.

Assuming that an input voltage of the buffer circuit 50 of the semiconductor laser drive circuit 100 is directly input to the switch circuit 60, collector voltages (collector potentials) of the transistors Q6 and Q8 of the first and second switch circuits 61 and 62 become higher along with a source terminal voltage of the FET.

As a result, there is a possibility that a forward voltage will be applied between the collector and base of the transistors Q6 and Q8, the transistors Q6 and Q8 will become saturated, and the output signal waveform will become deviated.

Furthermore, when the amplitude of the input voltage is small, the transistors Q6 and Q8 may no longer turn on or off. Even if the transistors Q6 and Q8 turn on or off, the output signal waveform may become blunted due to level-shifting in the switch circuit 60.

Therefore, it is preferable that the level-shift circuit 50 be connected before the switch circuit 60.

The first and second switch circuits 61 and 62 are current switch logic (CSL) circuit comprised by an ECL circuit. When one of the differential pair transistors Q6 and Q7 is in on, the other is off. Also, when one of the differential pair transistors Q8 and Q9 is on, the other is off.

The collector current of the transistor Q4 is equal to the collector current of the on transistor Q6 or Q7, while the collector current of the transistor Q5 is equal to the collector current of the on transistor Q8 or Q9.

The control voltage V2 of the FETs 2A and 2B is determined by the collector current i2 of the transistor Q6 and the collector current i3 of the transistor Q8. The control voltage V2 is expressed by the formula (3) below. Note that the resistance value of the resistor R12 is expressed as R12.

$$V2=(i2+i3) \times R12 + V1 \qquad (3)$$

The constant voltage circuit 70 is a sink type voltage source and configured by one transistor amplifying circuit and buffer amplifier.

In the constant voltage circuit 70, a feedback resistor R17 is provided so that the output voltage V1 does not change by a load current I13. The output voltage V1 is kept constant by the resistor R17 unless the input voltage Vin changes.

Then the constant voltage circuit 70 supplies a gate bias voltage of the FETs 2A and 2B in order to fulfill an operation voltage of the GaN-based semiconductor laser 3.

The output voltage V1 of the constant voltage circuit 70 can be expressed by a formula (4). Note that a base-emitter voltage of the transistor Q12 is indicated as Vbe1 and resistance values of the resistors R16, R17, and R18 are indicated as R16, R17, and R18. Also, the input voltage V1 satisfies formula (5) below.

$$V1=(Vin-Vbe1) \times (1+R17/R18) \qquad (4)$$

$$V1 \leq (R17+R18) \times Vcc/(R16+R17+R18) \qquad (5)$$

The signal combining resistor R12 converts a sum of the output currents (i2+i3) generated in the current switch (CSL) circuits 61 and 62 to a voltage and generates a control voltage V2 to which a constant voltage V1 is superimposed. The control voltage V2 is expressed by a formula (6) next by using the above formulas (3) and (4).

$$V2=(i2+i3) \times R12 + (Vin-Vbe1) \times (1+R17/R18) \qquad (6)$$

The source follower 4 drives the GaN-based semiconductor laser 3 by a voltage.

In the DC characteristic, a load current Io flowing into the GaN-based semiconductor laser 3 is determined by voltage-current characteristics of the GaN-based semiconductor laser 3 and gate-source voltage-drain current characteristics of the FETs 2A and 2B.

The load current Io is expressed by a formula (7) below. Note that in formula (7), Vo is a terminal voltage of the GaN-based semiconductor laser 3, Vt is a threshold voltage of the FETs 2A and 2B, and Idds is a drain saturation current.

$$Io=Idds \times \{1+(V2-Vo)/Vt\}^2 \qquad (7)$$

In the power source circuit 1, a constant current source having a transistor Q15 and a saturation switch circuit having a transistor Q16 are connected in a push-pull structure. Also, the saturation switch circuit controls a destination of flow of a constant current I5 from the constant current source so as to allow or prevent the flow of the constant current I5 to the load resistor R23.

The output voltage Vp of the power source circuit 1 is determined by the current I23 flowing into the load resistor R23 and expressed by a formula (8) below. Note that the base-emitter voltage of the transistor Q14 is expressed as Vbe2 and a resistance value of the load resistor R23 is expressed as R23.

$$Vp=I23 \times R23 - Vbe2 \qquad (8)$$

As explained above, when the transistor Q16 is on, the current I23 becomes 0 or substantially 0 and the transistor Q14 becomes off. As a result, the GaN-based semiconductor laser 3 becomes completely off.

When the transistor Q16 is off, the current I23 is equal to the constant collector current I5, and the transistor Q14 becomes on and supplies the output voltage Vp to the source follower 4.

The source follower 4 is configured to drive the GaN-based semiconductor laser 3 by voltage. The output resistance (output impedance) is small, and the output capacity is small enough to be negligible.

Further, by using the FETs 2A and 2B in parallel, the output resistance can be made further smaller which also enables high speed driving.

Also, since the source follower 4 can also suppress the mirror effect, it is possible to suppress a delay of a pulse response even when the resistance value of the load resistor is large.

Further, for example, even when a capacitor is connected in parallel to the load resistor, a current can be supplied to the load resistor almost regardless of the capacitance.

Since the GaN-based semiconductor laser 3 is configured so that the capacitor is connected in parallel to the load resistor if ignoring the inductance of the lead, a current can be supplied to the load resistor without being affected much at all by the capacitance of the capacitor, an output waveform of the laser light can be prevented from becoming blunt, and thus high speed driving is realized from this point as well.

Second Embodiment

Figure 3:
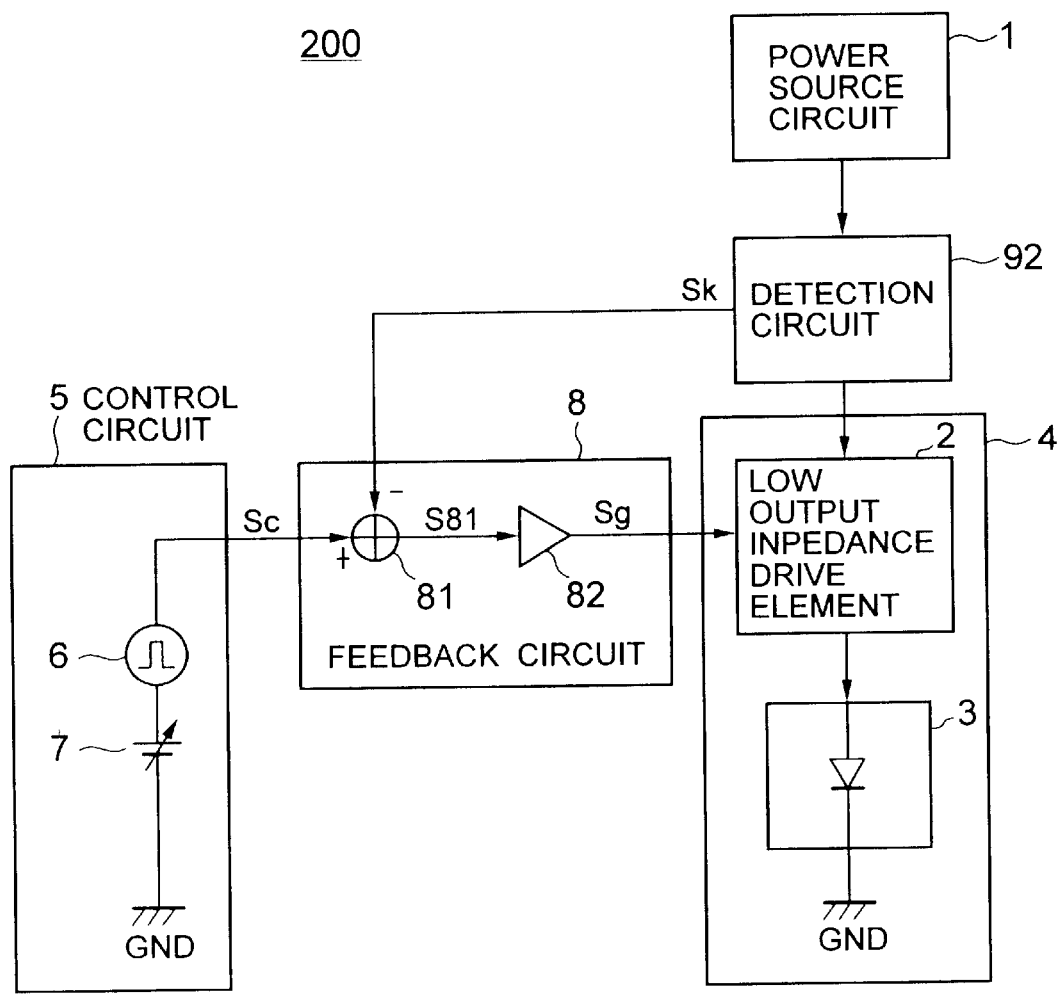
FIG. 3 is a schematic block diagram of the configuration of a semiconductor laser drive circuit according to a second embodiment of the present invention.

FIG. 3 is a schematic block diagram of the configuration of a semiconductor laser drive circuit according to a second embodiment of the present invention.

The semiconductor laser drive circuit 200 comprises the semiconductor laser drive circuit 100 in FIG. 1 provided with a detection circuit 92 and a feedback circuit 8.

Note that the same reference numerals are assigned to identical components as those in the semiconductor laser drive circuit 100 in FIG. 1 and the explanation of the identical components will be omitted.

A schematic equivalent circuit is illustrated inside the control circuit 5 in FIG. 3. A signal generating source 6 of a drive control signal Sc and a variable voltage source 7 are connected in series.

The control circuit 5 supplies the drive control signal Sc to the feedback circuit 8.

The detection circuit 92 is connected between a power source circuit 1 and a source follower 4, detects a current flowing into the source follower 4 from the power source circuit to generate a detection signal Sk, and supplies the detection signal Sk to the feedback circuit 8.

The feedback circuit 8 comprises an adder circuit 81 and an amplifying circuit 82.

The adder circuit 81 is supplied with the drive control signal Sc and the detection signal Sk, subtracts the detection signal from the drive control signal Sc to generate an adder signal S81, and supplies the adder signal S81 to the amplification circuit 82.

The amplification circuit 82 is configured for example by an operational amplifier, a transistor, an FET, etc., amplifies the adder signal S81 to generate an amplification signal Sg, and supplies the amplification signal Sg as a gate input signal to the source follower 4.

In the semiconductor laser drive circuit 200, the detection circuit 92, the feedback circuit 8, and the source follower 4 form a feedback group.

The operation of the GaN-based semiconductor laser 3 is stabilized by detecting the current flowing to the GaN-based semiconductor laser 3 inside the source follower 4, converting the level and voltage of the detected current value to generate a detection signal Sk, and feeding back the detection signal Sk.

The semiconductor laser drive circuit 200 is configured to detect a value of the current flowing to the GaN-based semiconductor laser 3 and capable of controlling the inflowing current without depending on voltage-current characteristics of the GaN-based semiconductor laser 3.

Also, even in a case where a pulse current is flowing into the source follower 4 from the power source circuit 1, the inflowing current can be controlled by setting a broad frequency bandwidth for the detection circuit 91 and the feedback circuit 8 to operate.

Third Embodiment

Figure 4:
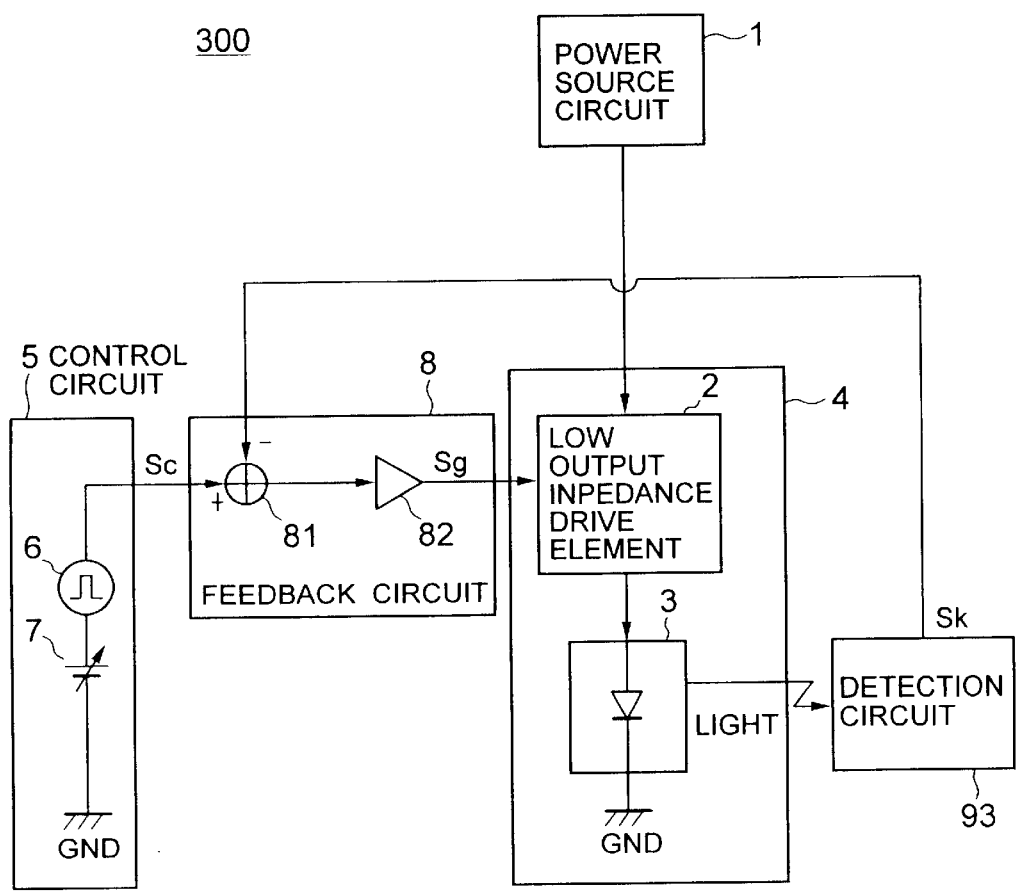
FIG. 4 is a schematic block diagram of the configuration of a semiconductor laser drive circuit according to a third embodiment of the present invention.

FIG. 4 is a schematic block diagram of the configuration of a semiconductor laser drive circuit according to a third embodiment of the present invention.

The semiconductor laser drive circuit 300 is comprised of the semiconductor laser drive circuit 200 in FIG. 3 without the detection circuit 92, with a power source circuit 1 which supplies power directly to the source follower 4, and with a detection circuit 93.

Note that the same reference numerals are assigned for identical components as those in the semiconductor laser drive circuit 200 in FIG. 3. The explanation of the identical components will be omitted.

The detection circuit 93 detects an emission output of a GaN-based semiconductor laser 3 to generate a detection signal Sk and supplies the detection signal Sk to a feedback circuit 8.

For example, the detection circuit 93 splits laser light output from the GaN-based semiconductor laser 3 by using a beam splitter, receives the split laser light by a light receiving element, converts it to an electric signal, and amplifies the electric signal to obtain the detection signal Sk.

Fourth Embodiment

Next, a semiconductor laser drive circuit according to a fourth embodiment of the present invention will be explained.

FIGS. 5 to 8 are schematic circuit diagrams of the semiconductor laser drive circuit according to the fourth embodiment of the present invention.

Figure 5:
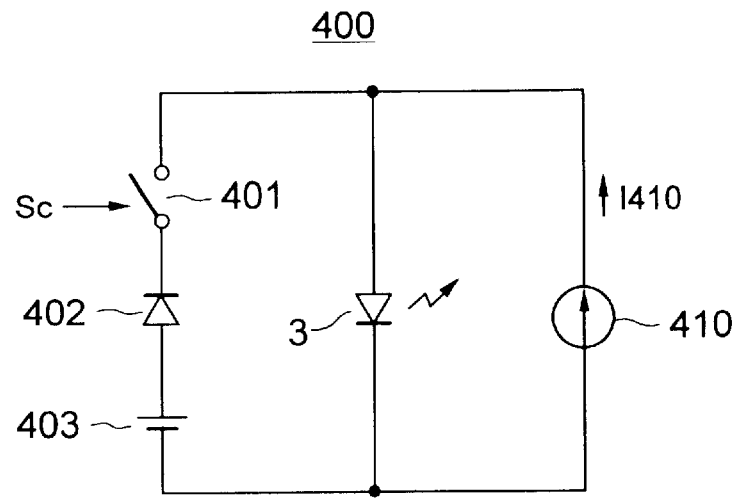
FIG. 5 is a schematic circuit diagram for explaining a principle of a semiconductor laser drive circuit according to a fourth embodiment of the present invention.

FIG. 5 is a schematic circuit diagram for explaining a principle of the semiconductor laser drive circuit according to the fourth embodiment of the present invention.

The semiconductor laser drive circuit 400 comprises a switching element 401, a diode 402, a constant voltage source 403, a GaN-based semiconductor laser 3, and a constant current circuit 410.

The constant current circuit 410 supplies a constant current I410 to the GaN-based semiconductor laser 3.

In the semiconductor laser drive circuit 400, the switching element 401, the diode 402, and the constant voltage source 403 are connected in series. The switching element 401 becomes on or off by a drive control signal Sc.

The constant voltage source 403 supplies a constant voltage to the GaN-based semiconductor laser 3 when the switching element 401 is on.

In the semiconductor laser drive circuit 400, a biasing use direct current is generated in the constant current circuit 410, while at the time of high speed driving, a pulse voltage is generated by using the switching element 401 and the pulse voltage is supplied to the GaN-based semiconductor laser 3 to enable high speed response.

In the semiconductor laser drive circuit 400, at the time of high speed driving, it is possible to drive the GaN-based semiconductor laser 3 without depending on voltage-current characteristics of the GaN-based semiconductor laser 3.

In this case, an equivalent resistance when an alternating small signal is input to the GaN-based semiconductor laser 3 becomes a current feedback resistance.

Figure 6:
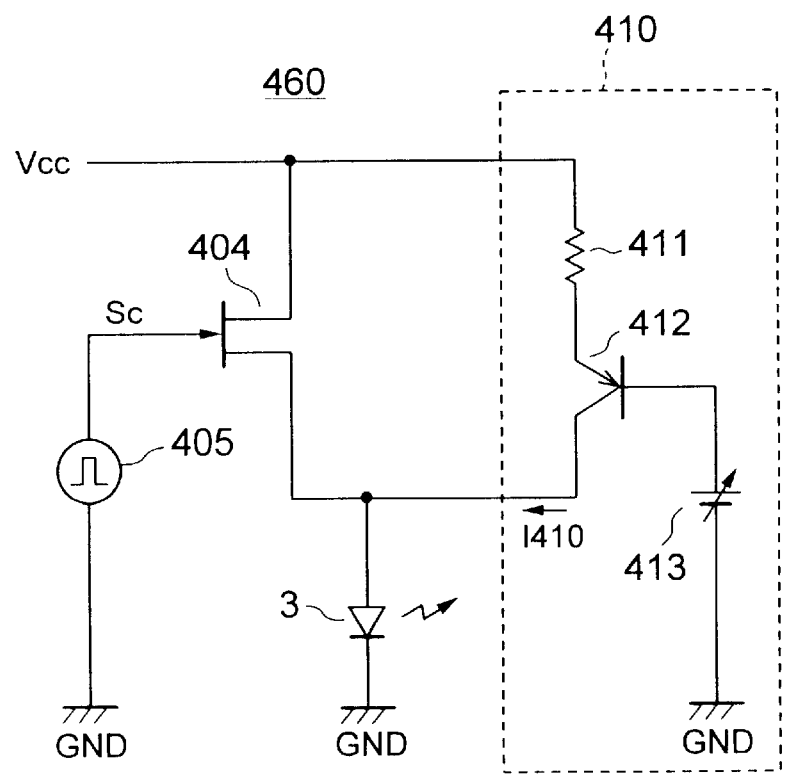
FIG. 6 is a schematic circuit diagram of an example of a semiconductor laser drive circuit according to the fourth embodiment of the present invention.

FIG. 6 is a circuit diagram of a preferable semiconductor laser drive circuit showing the semiconductor laser drive circuit 400 in FIG. 5 more specifically.

The semiconductor laser drive circuit 460 comprises an FET 404, a signal generating source 405 for generating a drive control signal Sc, a GaN-based semiconductor laser 3, and a constant current circuit 410.

The switching element 401 and the diode 402 in FIG. 5 are configured to be included in the FET 404 as an example of a low output impedance drive element.

The GaN-based semiconductor laser 3 is made to be driven by the source follower.

The constant current circuit 410 comprises an emitter resistor 411 supplied with a power source voltage Vcc, a transistor 412, and a variable voltage source 413. The transistor 412 is a pnp transistor.

The emitter of the transistor 412 is connected to the emitter resistor 411, the collector is connected to an anode of the GaN-based semiconductor laser 3, and the base is connected to the variable voltage source 413 so as to generate a constant collector current I410.

The FET 404 is an enhancement type n-channel field effect transistor. For example, a GaAs FET is used.

The drain of the FET 404 is supplied with a power source voltage Vcc, the gate is connected to the signal generating source 405, and the source is connected to an anode of the GaN-based semiconductor laser 3. A cathode of the GaN-based semiconductor laser 3 is grounded.

When the FET 404 is on, a drive voltage from the FET 404 is supplied to the GaN-based semiconductor laser 3 and the GaN-based semiconductor laser 3 outputs a blue-violet laser light.

When the FET 404 is off, the drive voltage from the FET 404 is not supplied to the GaN-based semiconductor laser 3. The GaN-based semiconductor laser 3 stops outputting light or emits light of a low output and/or a constant output based on the constant current I410.

Figure 7:
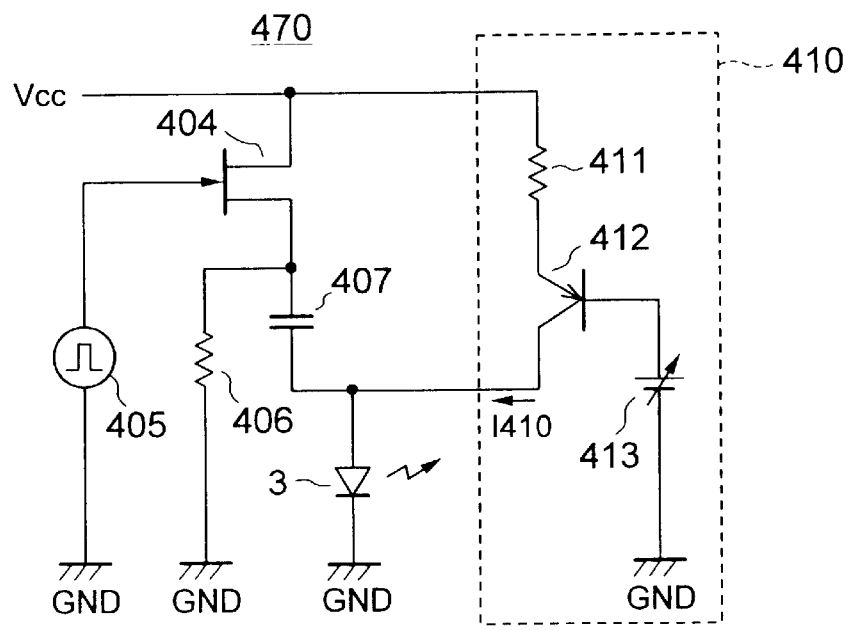
FIG. 7 is a schematic circuit diagram of another example of a semiconductor laser drive circuit according to the fourth embodiment of the present invention.

FIG. 7 is a circuit diagram of a modification of the semiconductor laser drive circuit 460 in FIG. 6.

Note that the same reference numerals are assigned for identical components as those in the semiconductor laser drive circuit 460 in FIG. 6 and the explanation of the identical components will be omitted.

The semiconductor laser drive circuit 470 is comprised of the semiconductor laser drive circuit 460 provided with a resistor (first resistor element) 406 and a capacitor 407. A source of the FET 404 is grounded via the resistor 406.

Also, a source of the FET 404 is connected to an anode of the GaN-based semiconductor laser 3 via the capacitor 407.

Since the resistor 406 and the capacitor 407 are provided, when a pulse voltage is output from the source of the FET 404, a high frequency component of the pulse voltage can be supplied to the GaN-based semiconductor laser 3 by a capacitor 407, a low frequency component of the pulse voltage can be blocked, and a high frequency voltage can be supplied to the GaN-based semiconductor laser 3 at the time of high speed driving.

Figure 8:
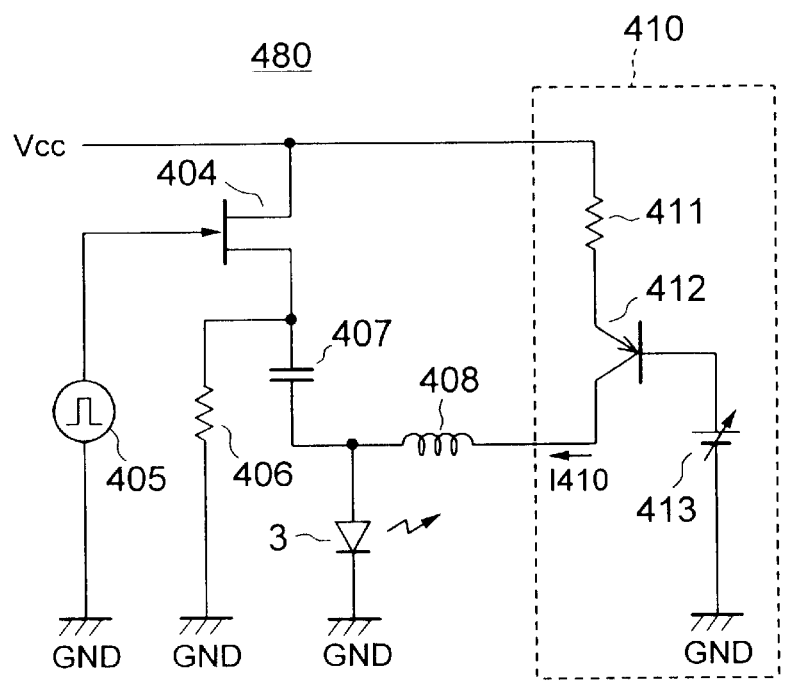
FIG. 8 is a schematic circuit diagram of another example of a semiconductor laser drive circuit according to the fourth embodiment of the present invention.

FIG. 8 is a circuit diagram of a modification of the semiconductor laser drive circuit 470 in FIG. 7.

Note that the same reference numerals are assigned for identical components as those in the semiconductor laser drive circuit 470 in FIG. 7 and the explanation of the identical components will be omitted.

The semiconductor laser drive circuit 480 is comprised of the semiconductor laser drive circuit 470 provided with an inductor 408 such as a choke coil between the constant current circuit 410 and the GaN-based semiconductor laser 3.

Since the inductor 408 is provided, when the output capacitor of the constant current circuit 410 (collector capacitor in FIG. 8) is at least the junction capacity of the GaN-based semiconductor laser 3, it is possible to prevent the pulse current from the capacitor 407 from flowing into an output terminal of the constant current circuit 410.

Note that a resistor (second resistor element) may be provided instead of the inductance between the constant current circuit 410 and the GaN-based semiconductor laser 3 and that the resistor and the inductance may be provided connected in series.

Also, the control circuit 5 may be connected to the gate of the FET 404 so as to supply a drive control signal Sc to the gate.

A bipolar transistor may be used as a low output impedance drive element and an emitter follower may be used instead of the source follower 4.

Further, the above embodiments are illustrations of examples of the present invention. The present invention is not limited to the above embodiments.

Summarizing the effects of the invention, in the semiconductor laser drive circuit according to the first aspect of the present invention, since a drive voltage is supplied to a high resistance semiconductor laser via the low output impedance drive element, power can be efficiently supplied to the high resistance semiconductor laser.

Also, the mirror effect can be suppressed by the low output impedance drive element, and the drive speed of the high resistance semiconductor laser can be improved by making the frequency of the drive control signal high.

Furthermore, since the control circuit comprises first and second switch circuits and a combining circuit for combining an output signal of the first and second switch circuits to generate the drive control signal, the control circuit is capable of changing a signal level of the drive control signal in many stages and controlling an emission intensity of the GaN-based semiconductor laser in many stages.

In a semiconductor laser drive circuit according to the second aspect of the present invention, since the drive voltage is supplied to the high resistance semiconductor laser via the low output impedance drive element, power can be effectively supplied to the high resistance semiconductor laser.

Also, the mirror effect can be suppressed by the low output impedance drive element, and the driving speed of the high resistance semiconductor laser can be improved by raising the frequency of the drive control signal.

Furthermore, an operation point of the high resistance semiconductor laser can be set by a constant current circuit connected to the high resistance semiconductor laser and a laser light intensity of the high resistance semiconductor laser during normal output can be set.

Also, by connecting the low output impedance drive element and the high resistance semiconductor laser via a capacitor, it is possible to supply a high frequency component in an output voltage of a low output impedance drive element to the high resistance semiconductor laser, to block a low frequency component, and to change the emission intensity of the GaN-based semiconductor laser to a pulse.

While the invention has been described with reference to specific embodiment chosen for purpose of illustration, it should be apparent that numerous modifications could be made thereto by those skilled in the art without departing from the basic concept and scope of the invention.

What is claimed is:

1. A semiconductor laser drive circuit for driving a high resistance semiconductor laser, comprising:
   a) a control circuit for generating a drive control signal, wherein said control circuit includes:
      1) a first switch circuit supplied with a first input signal and a first switch control signal and controlling and outputting a signal level of said first input signal based on said first switch control signal;

2) a second switch circuit supplied with a second input signal and a second switch control signal for controlling and outputting a signal level of said second input signal based on said second switch control signal; and 3) a combining circuit for combining output signals of said first and second switch circuits to generate said drive control signal;

b) a low output impedance drive element for driving said high resistance semiconductor laser by a voltage based on said drive control signal; and c) a constant voltage circuit for generating a biasing use constant voltage signal; wherein:

said high resistance semiconductor laser is driven in accordance with a plurality of operation modes; and said combining circuit combines said constant voltage signal and an output signal of said first switch circuit when in a first operation mode and combines said constant voltage signal and outputs of said first and second switch circuits when in a second operation mode.

2. A semiconductor laser drive circuit as set forth in claim 1, further comprising:

an oscillation circuit for generating an oscillation signal;

wherein said combining circuit combines said constant voltage signal and said oscillation signal when in a third operation mode.

3. A semiconductor laser drive circuit as set forth in claim 2, further comprising:

a resonance circuit connected between said oscillation circuit and said combining circuit;

wherein said combining circuit combines said oscillation signal passed through said resonance circuit and said constant voltage signal when in said third operation mode.

4. A semiconductor laser drive circuit for driving a high resistance semiconductor laser, comprising:

a) a control circuit for generating a drive control signal, wherein said control circuit includes:

1) a first switch circuit supplied with a first input signal and a first switch control signal and controlling and outputting a signal level of said first input signal based on said first switch control signal;

2) a second switch circuit supplied with a second input signal and a second switch control signal for controlling and outputting a signal level of said second input signal based on said second switch control signal; and 3) a combining circuit for combining output signals of said first and second switch circuits to generate said drive control signal;

b) a low output impedance drive element for driving said high resistance semiconductor laser by a voltage based on said drive control signal;

c) a first level-shift circuit supplied with a third input signal for generating said first input signal by shifting the level of the third input signal; and d) a second level-shift circuit supplied with a fourth input signal for generating said second input signal by shifting the level of the fourth input signal.

5. A semiconductor laser drive circuit as set forth in claim 4, wherein:

each of said first and second level-shift circuits is a differential amplifying circuit including an emitter coupled logic circuit;

said first switch circuit is a current switch logic circuit with a power source connected to an emitter of differential pair transistors and with an output current of the power source set by said first switch control signal; and said second switch circuit is a current switch logic circuit with a power source connected to an emitter of differential pair transistors and with an output current of the power source set by said second switch control signal.

6. A semiconductor laser circuit as set forth in claim 4, further comprising:

a first waveform shape circuit supplied with a fifth input signal for shaping a waveform of the fifth input signal to generate said third input signal; and a second waveform shape circuit supplied with a fifth input signal for shaping a waveform of the sixth input signal to generate said fourth input signal.

* * * * *

UNITED STATES PATENT AND TRADEMARK OFFICE
CERTIFICATE OF CORRECTION

PATENT NO.    : 6,590,914 B1
DATED         : July 8, 2003
INVENTOR(S)   : Hironobu Tanase et al.

It is certified that error appears in the above-identified patent and that said Letters Patent is hereby corrected as shown below:

Column 3,
Line 34, change "speed a" to -- speed of a --.

Column 8,
Line 34, change "RIO" to -- R10 --.

Signed and Sealed this

Twenty-fourth Day of February, 2004

JON W. DUDAS
*Acting Director of the United States Patent and Trademark Office*